(12) United States Patent
Mehrad et al.

(10) Patent No.: US 6,897,516 B2
(45) Date of Patent: May 24, 2005

(54) FLASH MEMORY ARRAY STRUCTURE AND METHOD OF FORMING

(75) Inventors: Freidoon Mehrad, Plano, TX (US); Suresh Potla, Dallas, TX (US); Zhihao Chen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/411,451

(22) Filed: Apr. 10, 2003

(65) Prior Publication Data

US 2003/0207527 A1 Nov. 6, 2003

Related U.S. Application Data

(62) Division of application No. 10/176,139, filed on Jun. 20, 2002, now Pat. No. 6,566,200.
(60) Provisional application No. 60/302,884, filed on Jul. 3, 2001.

(51) Int. Cl.[7] ............................................. H01L 29/788
(52) U.S. Cl. ....................................... 257/315; 257/506
(58) Field of Search .............................. 257/315, 382, 257/384, 333, 506, 510, 519, E21.658; 438/201, 212, 268, 655, 683, 262, 263, 296, 430, 433, 524

(56) References Cited

U.S. PATENT DOCUMENTS

| | | | |
|---|---|---|---|
| 4,951,103 A | * | 8/1990 | Esquivel et al. ............. 257/321 |
| 5,278,438 A | * | 1/1994 | Kim et al. .................. 257/316 |
| 5,412,600 A | * | 5/1995 | Nakajima .............. 365/185.17 |
| 5,672,524 A | * | 9/1997 | Liu et al. ..................... 438/270 |
| 5,751,040 A | * | 5/1998 | Chen et al. .................. 257/332 |
| 5,885,896 A | | 3/1999 | Thakur et al. |
| 6,040,231 A | | 3/2000 | Wu |
| 6,191,446 B1 | * | 2/2001 | Gardner et al. ............. 257/330 |
| 6,218,265 B1 | | 4/2001 | Colpani |
| 6,303,480 B1 | | 10/2001 | Desai et al. |
| 6,417,555 B1 | | 7/2002 | Ueno et al. |

* cited by examiner

Primary Examiner—Craig A. Thompson
Assistant Examiner—Jennifer M Dolan
(74) Attorney, Agent, or Firm—Jacqueline J. Garner; W. James Brady, III; Frederick J. Telecky, Jr.

(57) ABSTRACT

A method of forming a flash memory array structure includes forming a first dielectric layer outwardly from a semiconductor substrate, removing a portion of the first dielectric layer and the substrate to create a trench isolation region, forming a second dielectric layer in the trench isolation region, removing a portion of the second dielectric layer to create an exposed substrate region proximate a bottom of the trench isolation region, doping the exposed substrate region with an n-type dopant, and forming a silicide region in the exposed substrate region.

10 Claims, 3 Drawing Sheets

FLASH MEMORY ARRAY STRUCTURE AND METHOD OF FORMING

This is a divisional application of Ser. No. 10/176,139 filed Jun. 20, 2002 now U.S. Pat. No. 6,566,200 which is a non-provisional application of provisional application No. 60/302,884 filed Jul. 3, 2001.

TECHNICAL FIELD OF THE INVENTION

The present invention relates generally to the field of non-volatile memory devices and, more particularly, to a flash memory array structure and method of forming.

BACKGROUND OF THE INVENTION

Many non-volatile memory devices are fabricated with semiconductor materials. One such non-volatile memory device is a flash memory array. Flash memory arrays are semiconductor devices that are formed from an array of memory cells with each cell having a floating gate transistor that includes a source, a drain, a floating gate, and a control gate. The sources of each floating gate in each cell are connected to form a source line.

The floating gate transistors of a flash memory array are electrically isolated from one another by isolation structures. One type of isolation structure used is a Shallow Trench Isolation ("STI") structure. STI structures are generally formed by etching a trench between the cells and filling the trench with a suitable dielectric material. STI structures used in flash memory arrays result in high resistance of the source line, which reduces the operational performance of the memory. In addition, in flash memory arrays there is only one source contact for each source line, which is coupled to the sources of each memory cell in a line of memory cells. Therefore, each memory cell has a different source resistance depending on the location of the memory cell with respect to the source contact. This results in a wide threshold voltage distribution for the entire flash memory array.

SUMMARY OF THE INVENTION

According to one embodiment of the invention, a method of forming a flash memory array structure includes forming a first dielectric layer outwardly from a semiconductor substrate, removing a portion of the first dielectric layer and the substrate to create a trench isolation region, forming a second dielectric layer in the trench isolation region, removing a portion of the second dielectric layer to create an exposed substrate region proximate a bottom of the trench isolation region, doping the exposed substrate region with an n-type dopant, and forming a silicide region in the exposed substrate region.

Embodiments of the invention provide a number of technical advantages. Embodiments of the invention may include all, some, or none of these advantages. Source line resistance in flash memory arrays may be substantially reduced or eliminated. In addition, a tight flash memory array threshold voltage ("Vt") distribution may be obtained.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Example embodiments of the present invention and their advantages are best understood by referring now to FIGS. 1A through 2F of the drawings, in which like numerals refer to like parts.

Figure 1A:
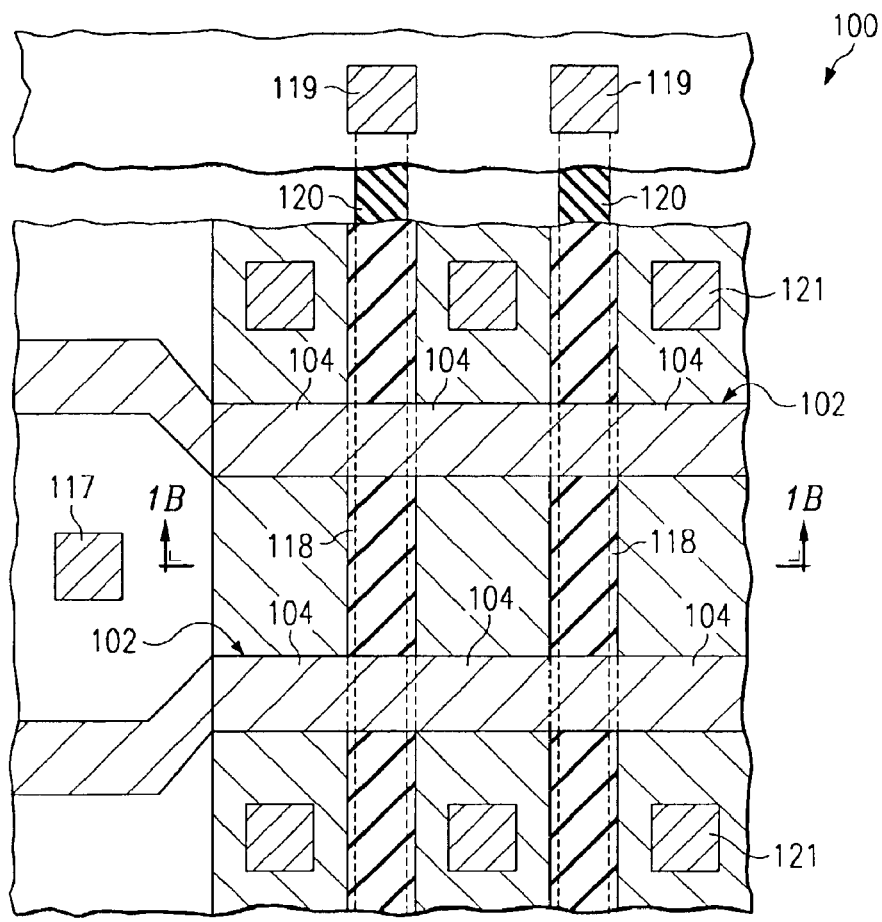
FIG. 1A is a partial plan view of a partially completed flash memory array structure manufactured according to the teachings of the present invention.
Figure 1B:
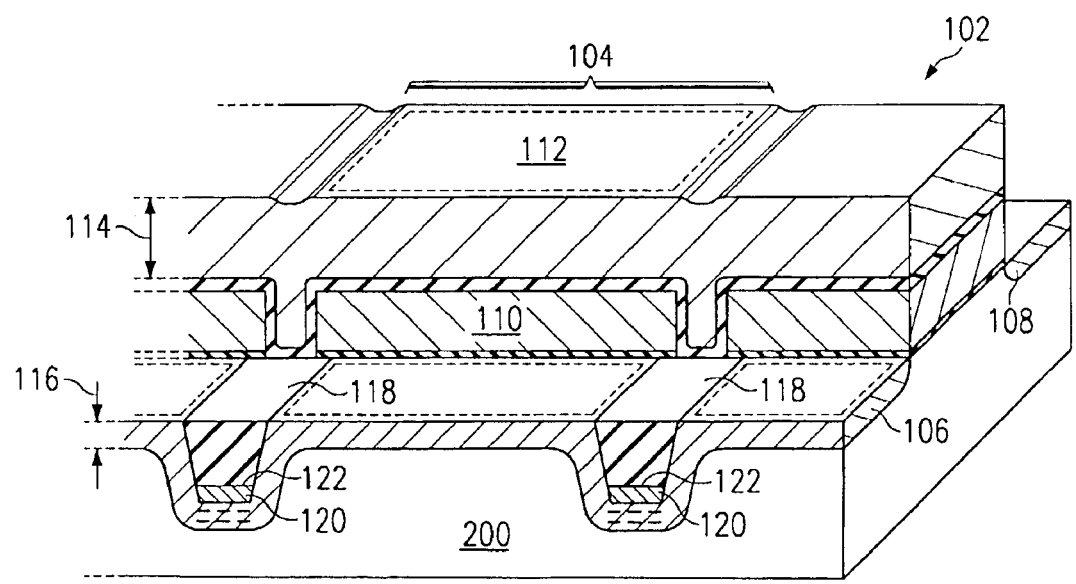
FIG. 1B is a partial perspective view of the partially completed flash memory array structure of FIG. 1A illustrating silicide regions at the bottom of shallow trench isolation regions according to the teachings of the present invention.

FIG. 1A is a partial plan view of a partially completed flash memory array structure 100 manufactured according to the teachings of the present invention. FIG. 1B is a partial perspective view of flash memory array structure 100. Referring to FIGS. 1A and 1B, flash memory array structure 100 comprises a plurality of memory cells 102 (sometimes referred to as "bits") arranged in rows and columns. Each memory cell 102 includes a floating gate transistor 104 having a source 106, a drain 108, a floating gate 110, and a control gate 112. Each of control gates 112 in a row of memory cells 102 is coupled to a word line 114. Each of sources 106 in a row of memory cells 102 is coupled to a source line 116. FIG. 1A also shows flash memory array structure 100 having a source line contact 117, a plurality of source contacts 119, and a plurality of drain contacts 121.

Floating gate transistors 104 of flash memory array structure 100 are electrically isolated from one another by trench isolation structures 118. In the illustrated embodiment, trench isolation structures 118 are shallow trench isolation ("STI") structures; however, other suitable trench isolation structures may be utilized. Typically, STI structures used in flash memory arrays result in high resistance of the source line (source line 116 in this example), which may reduce the operational performance of the memory. Further, because flash memory arrays typically have only one external source line contact (source line contact 117 in this example) for each source line in the array, each memory cell has a different source resistance depending on the location of the memory cell with respect to the source contact. This varying source resistance results in a wide threshold voltage distribution for the entire flash memory array. The present invention addresses these problems, and others, by providing a plurality of silicide regions 120 along a plurality of bottoms 122 of trench isolation structures 118.

Silicide regions 120 extend the length of trench isolation regions 118 (as illustrated in FIG. 1A) where each silicide region 120 couples to one source contact 119 at the outer edge of flash memory array structure 100. Source contacts 119 are coupled to source line contact 117 so that the source line resistance may be substantially reduced or eliminated. One method for forming silicide region 120 in flash memory array structure 100 is illustrated below in conjunction with FIGS. 2A through 2F.

FIGS. 2A through 2F are a series of cross-sectional views illustrating various manufacturing stages of flash memory array structure 100 according to one embodiment of the present invention.

Figure 2A:
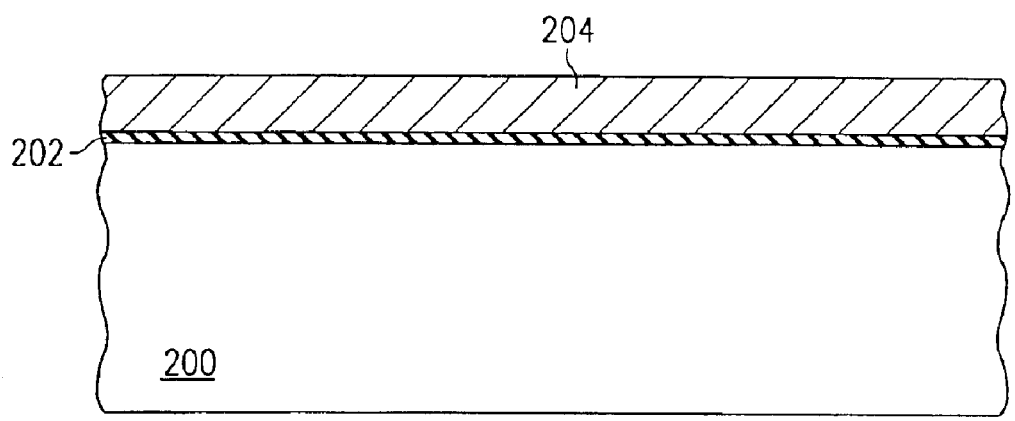
FIGS. 2A through 2F are a series of cross-sectional views illustrating various manufacturing stages of the flash memory array structure of FIGS. 1A and 1B.

FIG. 2A shows a substrate 200 having a first oxide layer 202 formed outwardly therefrom and a first nitride layer 204 formed outwardly from first oxide layer 202. In one embodiment, substrate 200 is formed from silicon; however, substrate 200 may comprise any suitable material used in semiconductor chip fabrication, such as germanium. First oxide layer 202 is formed from any suitable type of oxide using any suitable growth and/or deposition technique used in semiconductor processing. In one embodiment, first oxide layer 202 is referred to as a "pad ox" and is approximately 100 angstroms thick; however, other suitable thicknesses may be used. In one embodiment, first nitride layer 204 is formed from any suitable type of nitride using any suitable growth and/or deposition technique used in semiconductor processing; however, first nitride layer 204 may be formed from other suitable materials that act as a dielectric. In one embodiment, first nitride layer 204 is approximately 2000 angstroms thick; however, other suitable thicknesses may be used.

Although FIG. 2A describes first oxide layer 202 and first nitride layer 204 as being separate dielectric layers, in other embodiments, only one dielectric layer is grown and/or deposited on substrate 200. For example, a layer of oxide only, a layer of nitride layer only, or another suitable dielectric layer only may be grown and/or deposited on substrate 200.

Figure 2B:
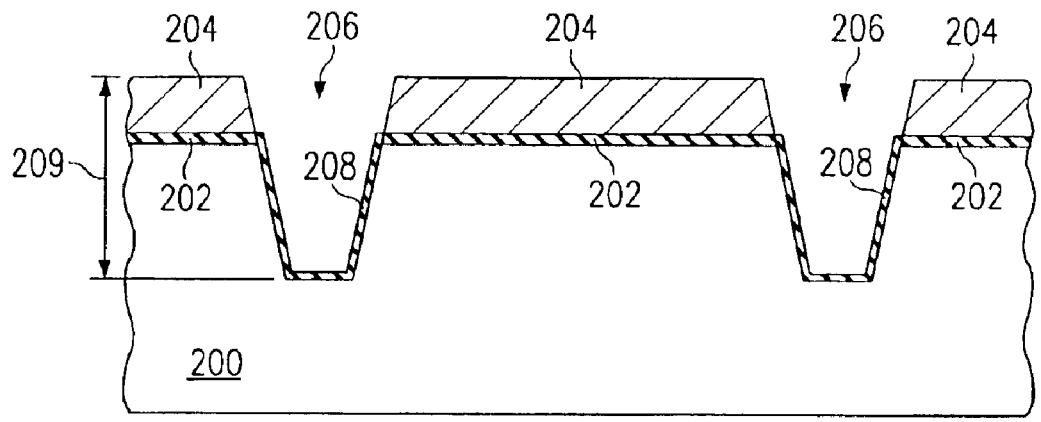

FIG. 2B shows a pair of trenches 206 and a liner oxide layer 208 formed in trenches 206. Although two trenches 206 are shown, only one trench 206 is referred to throughout the remainder of the detailed description for clarity. In one embodiment, trench 206 is formed as follows: A photoresist layer (not explicitly shown) is applied to the outer surface of first nitride layer 204. The photoresist layer is then masked and selectively stripped using suitable photolithographic techniques to expose a portion of first nitride layer 204. The exposed portion is then etched using any suitable etching technique to remove the exposed portion of first nitride layer 204 and a portion of first oxide layer 202. The photoresist layer is then stripped and removed using suitable well known techniques. After stripping and removing the photoresist layer, an anisotropic dry etch is performed on the exposed portion of substrate 200 to etch substrate 200 down to a predetermined depth 209. Any suitable anisotropic dry etch process, such as a plasma etch, may be used to define trench 206. Trench 206 may be formed to any suitable depth 209. In one embodiment, depth 209 is on the order of 0.3–0.5 microns.

After defining trench 206, liner oxide layer 208 is formed in trench 206. Liner oxide layer 208 comprises any suitable type of oxide and is formed using any suitable growth and/or deposition technique used in semiconductor processing. In one embodiment, liner oxide layer 208 is approximately 150 angstroms thick; however, other suitable thicknesses may be used.

Figure 2C:
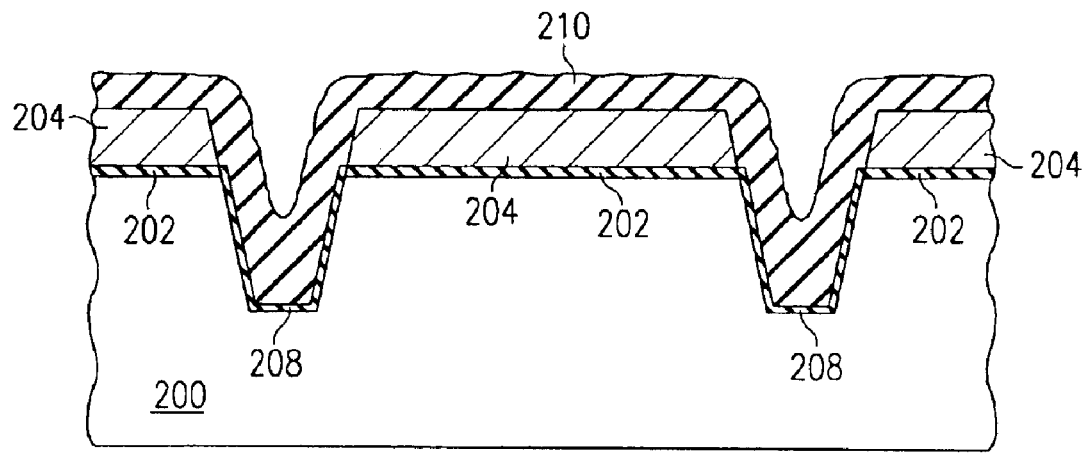

FIG. 2C shows a second oxide layer 210 formed in trench 206 and outwardly from first nitride layer 204. Second oxide layer 210 comprises any suitable type of oxide and is formed using any suitable growth and/or deposition technique used in semiconductor processing. For example, an atmospheric pressure chemical vapor deposition ("APCVD") process may be used to form second oxide layer 210. In one embodiment, second oxide layer 210 is formed with a thickness between approximately 700 angstroms and approximately 1000 angstroms. In a particular embodiment, second oxide layer 210 is formed with a thickness of approximately 800 angstroms. Second oxide layer 210 should be deposited with sufficient thickness such that sidewalls may be formed in trench 206, as described below in conjunction with FIG. 2D.

Figure 2D:
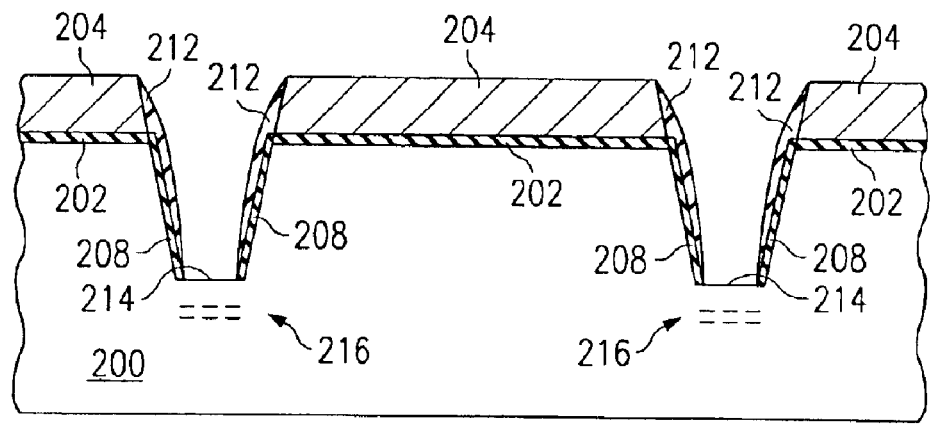

FIG. 2D shows a portion of second oxide layer 210 removed to create a pair of sidewalls 212 on the sides of trench 206. One way of removing a portion of second oxide layer 210 is to perform an anisotropic dry etch. Any suitable anisotropic dry etch process, such as a plasma etch, may be used to define sidewalls 212. Removing a portion of second oxide layer 210 also creates an exposed substrate region 214 proximate bottom 122 of trench 206.

FIG. 2D also shows an N-type dopant 216 formed in substrate 200 in exposed substrate region 214. N-type dopant 216 may be formed in exposed substrate region 214 using any suitable doping process, such as an implantation and/or diffusion process. N-type dopant 216 may be doped to any suitable depth in exposed substrate region 214. N-type dopant 216 may be any suitable N-type dopant, such as arsenic, phosphorous, or antimony. N-type dopant 216 serves as a pre-amorphization implantation and aids in diode junction formation.

Figure 2E:
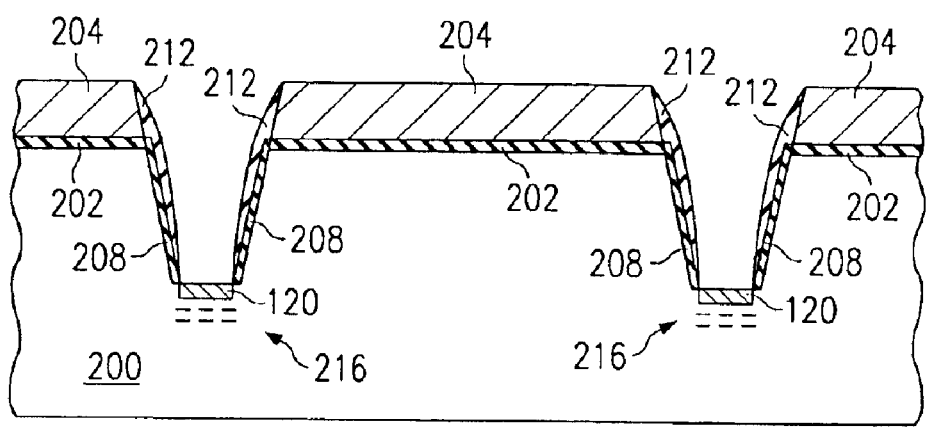

FIG. 2E shows silicide region 120 formed in exposed substrate region 214. Silicide is a region of silicon that has been diffused with a metal. In one embodiment, silicide region 120 is formed by forming a metal layer outwardly from exposed substrate region 214, annealing the metal layer at a temperature between approximately 300° C. and approximately 600° C. for a time period between approximately 5 seconds and approximately 60 seconds, removing any remaining portion of the metal layer that has not diffused into the silicon in substrate 200, and performing a rapid thermal anneal ("RTA") on exposed substrate region 214. The RTA is typically performed at a temperature between approximately 950° C. and approximately 1050° C. for a time period between approximately 5 seconds and 60 seconds. Any suitable metal may be used to form silicide region 120, such as cobalt, tungsten, or titanium.

Silicide regions 120 form conductive silicided paths at bottoms 122 of trench isolation regions 118 in flash memory array structure 100. As described above, these silicided paths are coupled to source contacts 119 (see FIG. 1A) so that the resistance of source line 116 is substantially reduced or eliminated and a narrow threshold voltage distribution for the entire flash memory array is obtained.

Figure 2F:
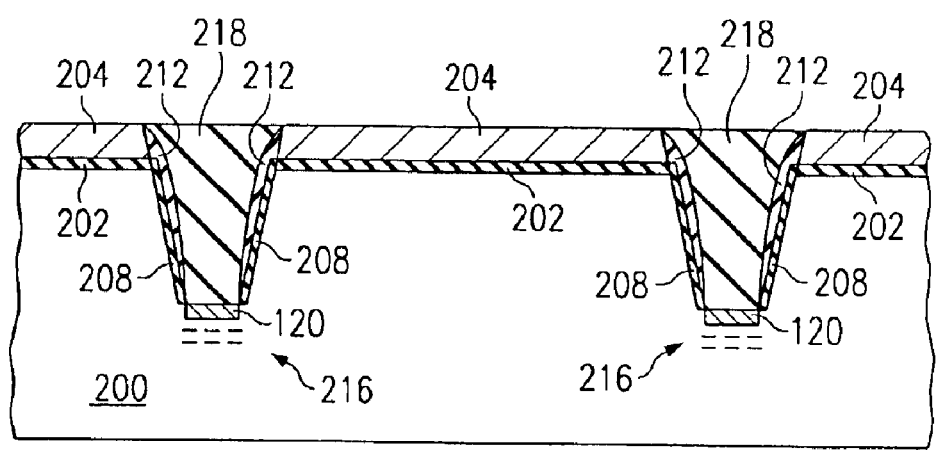

FIG. 2F shows a trench isolation oxide region 218 formed in trench 206. Trench isolation oxide region 218 is formed as follows: An oxide layer (not explicitly shown) is formed outwardly from first nitride layer 204 using any suitable growth and/or deposition technique used in semiconductor processing, such as an APCVD process. Thereafter, the depth of oxide layer is reduced in thickness by any suitable process, such as a chemical mechanical polish ("CMP") process. First nitride layer 204 is used as a stopping layer for the CMP process, which may result in a reduction in the thickness in first nitride layer 204. After reducing the thickness of the oxide layer, the fabrication of flash memory array structure 100 continues in any suitable manner.

Although embodiments of the invention and their advantages are described in detail, a person skilled in the art could make various alterations, additions, and omissions without departing from the spirit and scope of the present invention as defined by the appended claims.

What is claimed is:

1. A flash memory array structure, comprising:
   a first dielectric layer disposed outwardly from a semiconductor substrate;
   a trench isolation region formed in the substrate;
   a second dielectric layer disposed in the trench isolation region;

an exposed substrate region proximate a bottom of the trench isolation region formed by removing a portion of the second dielectric layer;

an n-type dopant region formed in the exposed substrate region; and a silicide region disposed in the exposed substrate region.

2. The flash memory array structure of claim 1, wherein the second dielectric layer has a thickness between approximately 700 Å and approximately 1000 Å.

3. The flash memory array structure of claim 2, wherein the second dielectric layer has a thickness of approximately 800 Å.

4. The flash memory array structure of claim 1, wherein the n-type dopant region comprises an arsenic region.

5. The flash memory array structure of claim 1, wherein the n-type dopant region comprises an phosphorus region.

6. The flash memory array structure of claim 1, wherein the n-type dopant region comprises an antimony region.

7. The flash memory array structure of claim 1, wherein the silicide region comprises a silicide selected from the group consisting of cobalt silicide, tungsten silicide, and titanium silicide.

8. A flash memory array structure comprising a trench isolation structure, wherein the trench isolation structure comprises:

a first dielectric layer disposed along sidewalls of a trench forming a sidewall structure not extending across a bottom of the trench;

a silicide region extending along the bottom of said trench;

a second dielectric layer lilting the trench; and an n-type dopant region located below said silicide region along the bottom of the trench.

9. The flash memory array structure of claim 8, wherein the silicide region comprises a silicide selected from the group consisting of cobalt silicide, tungsten silicide, and titanium silicide.

10. The flash memory array of claim 8, wherein said first dielectric layer comprises a liner layer and an oxide layer.

* * * * *